United States Patent [19]

Stinehelfer

[11] 4,231,110

[45] Oct. 28, 1980

[54] MEMORY ARRAY WITH SEQUENTIAL ROW AND COLUMN ADDRESSING

[75] Inventor: Jonathan J. Stinehelfer, Sunnyvale, Calif.

[73] Assignee: Fairchild Camera and Instrument Corp., Mountain View, Calif.

[21] Appl. No.: 7,103

[22] Filed: Jan. 29, 1979

[51] Int. Cl.³ .......................... G11C 8/00; G11C 7/00
[52] U.S. Cl. .................................. 365/194; 365/239
[58] Field of Search ................ 365/194, 195, 203, 239

[56] References Cited

U.S. PATENT DOCUMENTS

| 3,509,548 | 4/1970 | Sinden | 365/194 |
| 3,832,699 | 8/1974 | Matsue | 365/203 |

Primary Examiner—Stuart N. Hecker
Attorney, Agent, or Firm—Paul J. Winters; Ronald J. Meetin; Michael J. Pollock

[57] ABSTRACT

An electronic memory comprises a plurality of memory cells arranged in an array of rows and column, row address circuitry, column address circuitry, circuitry for sensing the logic states of the cells, and circuitry for delaying addressing of a selected column until after an addressed row has achieved a voltage level suitable for the sensing circuitry to sense. By so delaying the addressing of the selected column, the time required to read information out is reduced substantially—typically by a factor of two for a 1K or 2K × 8-bit static memory.

8 Claims, 6 Drawing Figures

MEMORY ARRAY WITH SEQUENTIAL ROW AND COLUMN ADDRESSING

BACKGROUND OF THE INVENTION

1. Field of the Invention

This invention relates to a memory array with improved addressing. More particularly, this invention relates to such a memory array in which an improved addressing scheme allows substantial reduction in memory accessing time. Most especially, this invention relates to a bipolar integrated circuit memory array in which a plurality of columns in the memory array are addressed for reading out information simultaneously, and in which a novel addressing scheme is used to reduce the access time for reading out information from the memory array.

2. Description of the Prior Art

Static bipolar integrated circuit memory arrays are well known in the art. For example, 4K×1-bit random access memories designated by product numbers 93470 and 93471 and fabricated using the Isoplanar process by Fairchild Camera and Instrument Corporation, Mountain View, California, have achieved substantial success in the market place. These memories are described by Herndon, Ho and Ramirez, "Static Bipolar Memory Chips Keep Shrinking", *Fairchild Journal of Semiconductor Progress*, Volume 5, Number 4, pages 16-18 (July-August 1977).

These memories are arranged in rows and columns, and a selected row and column are addressed substantially simultaneously in order to read information out of the memory array. This approach works well for a 4K×1 organization of the array, in which one bit of information is read out at a time. However, if it is desired to organize such memory array so that more than one column of information is read out simultaneously, for example, a 1K or 2K×8 organization, addressing the columns at the same time as the rows results in a substantial decrease in the rate of change of the row voltage, thus increasing the time it takes a row to reach a proper level for a read operation. Such a delay can easily double the time required for reading information out of the memory. As memory integrated circuit designers adapt the above memory arrays to different organizations, a need therefore exists for an improved scheme for addressing the memory arrays so that their access time can be reduced.

SUMMARY OF THE INVENTION

Accordingly, it is an object of this invention to increase the speed at which a memory is accessed for reading by delaying the addressing of a bit line until after a word line has reached a suitable voltage level for a read operation.

It is another object of the invention to provide a memory array in which noise and disturb sensitivity of the array during a read out operation is reduced by providing a sharp crossover point in the relationship between voltages which provide the information to be sensed.

It is a further object of the invention to provide a memory array in which delays in accessing the memory for reading out information due to a reduction in the rate a word line approaches a suitable voltage for reading are reduced.

The attainment of these and related objects is achieved through use of the novel sequential addressing approach herein disclosed. A memory array in accordance with this invention has a plurality of memory circuits arranged in rows and columns, the memory circuits in each row and each column being connected together by row lines and column lines. Sensing means for reading information out of the memory array is connected to each column line. First means is provided for addressing each of the row lines selectively. Similar second means is provided for addressing each of the column lines selectively. Means is provided for delaying the addressing of a column line until after an addressed row line has achieved a voltage level suitable for sensing by the sensing means. Delaying the column addressing in this manner results in a decrease in the time required to read information out of the memory array, since a high rate of change of voltage with respect to time on the row lines is maintained to bring a row line to a suitable voltage for sensing rapidly. This result is particularly significant in a memory arranged so that a number of columns are read out at the same time, such as a 1K or 2K×8 memory array.

The attainment of the foregoing and related objects, advantages and features of the invention should be more readily apparent after review of the following more detailed description of the invention, taken together with the drawings, in which:

DETAILED DESCRIPTION OF THE INVENTION

Figure 1:
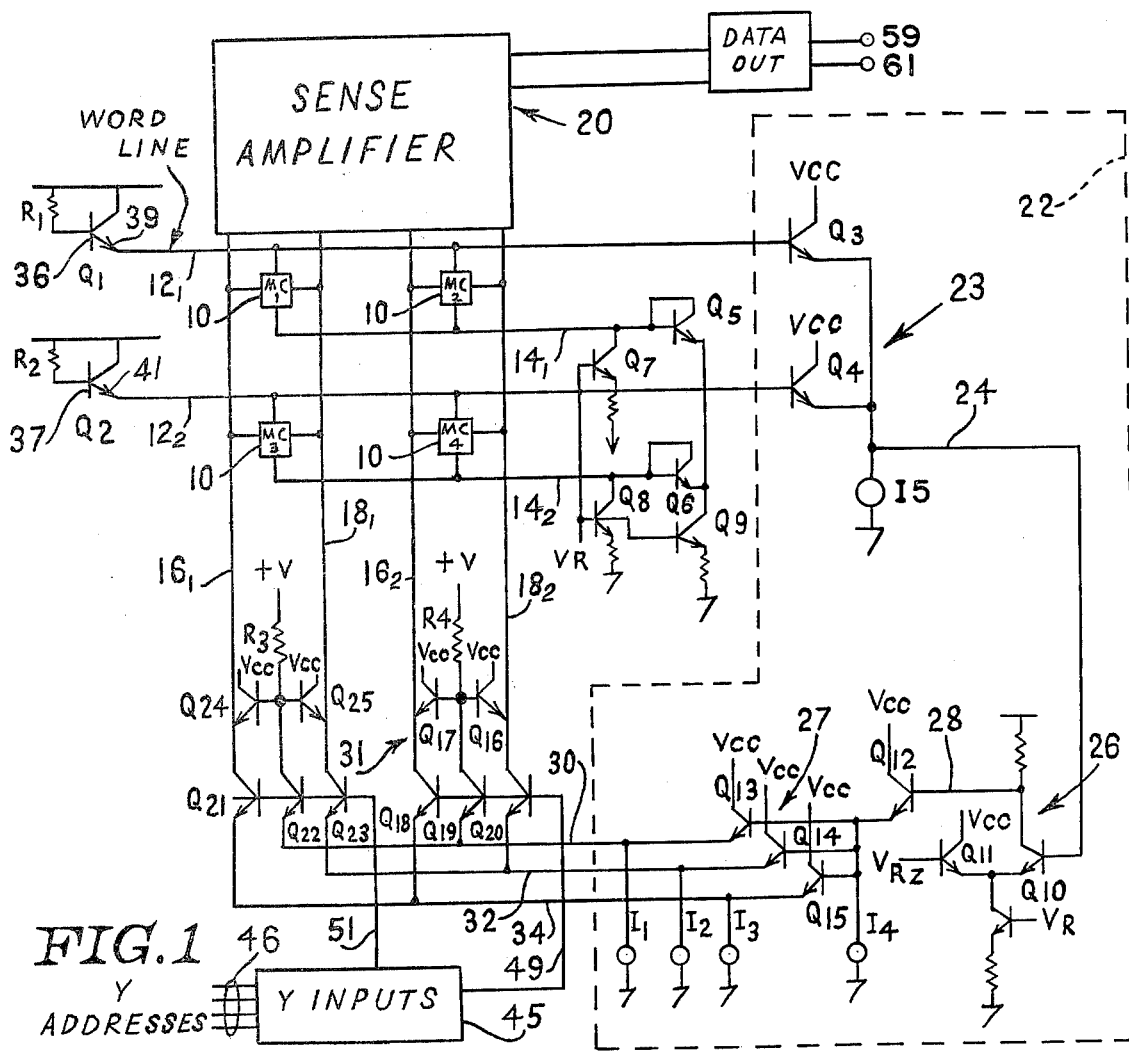
FIG. 1 is a schematic diagram of a memory array incorporating the invention.

Turning now to the drawings, and more particularly to FIG. 1, there is shown a memory array in accordance with the invention. The array includes a plurality of memory cells 10. As in the case of the above-referenced Herndon et al. publication, each of the memory cells 10 is a flip-flop composed of bipolar transistors as shown in the publication. An actual memory array contains, for example, 4,096 of the memory cells in a single integrated circuit chip. However, for ease of understanding, only four such circuits have been shown in FIG. 1.

Each of the memory cells 10 is connected to a first word line $12_X$ and to a second word line $14_X$, as shown X is a positive integer varying from 1 to 2. The word lines $12_X$ and $14_X$ thus serve to define rows of the memory cells 10, with all of the memory cells in a row having a common connection to first word line $12_X$ and second word line $14_X$. Similarly, first bit/sense lines $16_Y$ are connected to the memory cells 10 in columns as shown. Second bit/sense lines $18_Y$ are similarly connected to the memory cells 10 as shown Y is a positive integer varying from 1 to 2.

As is conventional, information is written into the memory cells 10 by coincident application of switching signals on word line $12_X$ and first and second bit lines $16_Y$ and $18_Y$, the signals depending on whether a "zero" or "one" is to be written into a particular memory cell 10. To read out information from a memory cell 10, a read signal is applied on the word line $12_X$ or 13 connected to the memory cell 10 to be read, and the state of the memory cell 10 is sensed by sense amplifier 20 connected to the bit lines $16_Y$ and $18_Y$ connected to the memory cell 10 to be read, with whichever of the bit lines $16_Y$ and $18_Y$ that is at a high voltage level indicating whether a "zero" or a "one" is stored in the memory cell 10. Addressing signals for selecting a particular memory cell 10 are provided on the word lines $12_1$ and $12_2$ by word line drivers Q1 and Q2, respectively, and one or more bit line pairs $16_Y$ and $18_Y$ by bit decode and accessing circuits 45. Bit line write signals are provided by bit driver transistors Q24, Q25, Q16 and Q17, depending on the information to be written into a memory cell 10.

It should be recognized that, when a read signal is applied to the word line $12_X$, the word line 12 does not attain its read level voltage instantaneously due to word line capacitance, but moves toward the read voltage level at a relatively rapid rate of change DV/DT. If one or more sets of bit lines $16_Y$ and $18_Y$ are also addressed for reading at the same time as a word line $12_X$, the effect is to slow down the rate of change DV/DT of the word line $12_X$ toward the read voltage level, as explained in more detail below. This is not a significant problem when only one set of bit lines $16_Y$ and $18_Y$ is addressed for reading at the same time as word line $12_X$. However, if it is desired to read out more than one memory cell 10 connected to a word line $12_X$ simultaneously, the resulting reduction in the rate of change DV/DT for the word line $12_X$ as it approaches the read voltage level causes a significant increase in access time for reading out information. In some cases, this delay may increase the access time for reading out information by a factor of two.

In accordance with this invention, the circuitry contained in dotted lines 22 has been added to the memory array in FIG. 1 to detect when a selected word line $12_X$ has reached its read voltage level and to delay the addressing of one or more of the bit lines pairs $16_Y$ or $18_Y$ to be addressed. Each of the word lines $12_1$ and $12_2$ is connected to the base of a transistor Q3 and Q4, respectively. The collectors of the transistors Q3 and Q4 are connected to a voltage source $V_{cc}$. The transistors Q3 and Q4 comprise a detector 23 which determines when the word lines $12_1$ and $12_2$ of the memory array are high. The emitter electrodes of the transistors Q3 and Q4 are each connected to line 24, which is connected to the base of transistor Q10 in buffer amplifier 26, which includes transistors Q10 and Q11. Buffer amplifier 26 is itself a well-known circuit and its details will therefore not be further explained except as necessary to understand the invention.

Buffer amplifier 26 is in turn connected to gating circuit 27, including transistors Q13, Q14 and Q15, by line 28 and transistor Q12. The emitter of transistor Q13 is connected by line 30 and transistors Q22 and Q19 to the bases of gating transistors Q24, Q25, Q16 and Q17. The emitter of transistor Q14 is connected via line 32 and transistors Q23 and Q20 to bit sense lines $18_Y$. The emitter of gating transistor Q15 is connected by line 34 and transistors Q21 and Q18 to the bit sense line $16_Y$. The collectors of transistors Q11, Q12, Q14, Q16, Q17, Q24 and Q25 are all connected to the voltage source Vcc.

Transistors Q16, Q17, and Q19 and resistor R4 form a bit line clamping circuit 31 for bit line pair $16_2$ and $18_2$, which operates as follows: If Q19 transistor is conducting, then current $I_1$ flows through resistor $R_4$, lowering the voltage on the bases of the clamping transistors Q16 and Q17. This allows the voltage on bit line pair $16_2$ and $18_2$ to be determined by the read or write operation. This condition represents the unclamped mode of the bit line clamping circuit 31.

The clamp circuit is operated on by the gating circuit 27 as follows: A logic "high" on line 28 enables Q13 which steers current $I_1$ away from transistors Q19 and Q22. This allows resistor R4 to raise the voltage on the bases of transistors Q16 and Q17, raising up bit lines $16_2$ and $18_2$.

The logic "high" on line 28 also enables gate transistors Q14 and Q15, which steers currents $I_2$ and $I_3$ into transistor Q14 and Q15, thus removing the currents from bit lines $16_2$ and $18_2$ (and bit lines $16_1$ and $18_1$ as well). This condition represents the clamped mode of the bit line clamping circuit 31. The clamping circuit, consisting of transistors Q24, Q25, and Q22 and resistor R3, operates in the same manner.

One or more bit line pairs $16_Y$ and $18_Y$ are selected in response to Y addresses supplied at inputs 46 by decode and bit line access circuits 45 by bringing the bases of transistors Q21 and Q23 and/or transistors Q18 and Q20 high with appropriate signals on lines 51 and/or 49, respectively. This steers current $I_2$ to transistors Q20 and/or Q23 and current $I_3$ to transistors Q18 and/or Q21, thus selecting the appropriate bit line pair or pairs $16_Y$ and $18_Y$.

Transistors Q5, Q6 and Q9 form a word line discharge circuit which removes charge from unselected word lines to bring them low. This discharge circuit operates in the same manner as in the commercially available memory arrays designated by product numbers 93470 and 93471 and described in the above-referenced Herndon et al. article.

Transistors Q7 and Q8 supply a small amount of current to the unaddressed memory cells to enable them to remember. This current is called memory cell standby or keep-a-live current.

As will be seen shortly, the operation of circuit 22 advantageously introduces a delay in the application of the column address signal to a bit line pair $16_Y$ and $18_Y$ relative to the application of a row address signal to a word line $12_X$.

Figure 2:
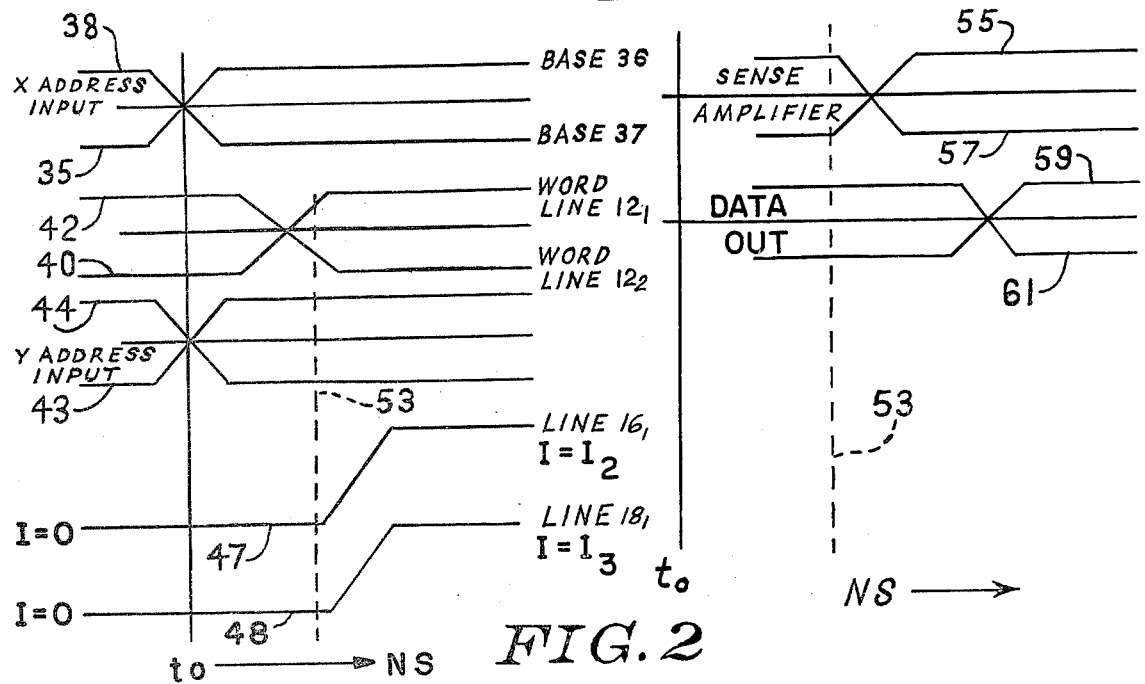
FIG. 2 is a set of waveform diagrams showing operation of the memory array in FIG. 1.

The operation of the memory array in FIG. 1 will now be explained in conjunction with the pulse program waveforms of FIG. 2. Access to a memory cell 10 (assumed in this explanation to be the memory cell 10 located in the upper left-hand corner of FIG. 1) begins by the application of an X address input 35 to base 36 of transistor Q1 to raise it to a high state, as shown by waveform 35. The initial low state of base 36 assumes that word line $12_1$ was de-selected in the previous access of the memory array. At the same time, base 37 of transistor Q2 is brought low, as shown by waveform 38. The initial high state of base 37 assumes that word line $12_2$ was selected in the previous access of the memory array. The crossover point of waveforms 35 and 38 is taken at time $t_o$, as shown in FIG. 2. As base 36 of transistor Q1 goes high, its emitter 39 follows, thus raising word line 12, as shown by waveform 40 in the second set of waveforms of FIG. 2. Similarly, as base 37 of transistor Q2 goes low, its emitter 41 follows, thus lowering the voltage of unselected word line $12_2$, as shown by waveform 42. About 10 nanoseconds elapse form time $t_o$ to the crossover point of waveforms 42 and 40.

At the same time as the X address inputs 35 and 38 shown, Y address inputs 43 and 44 are generated in Y address circuitry 45 in response to a Y address supplied on lines 46. However, the use of these inputs to generate column select waveforms 47 and 48 on lines $16_1$ and $18_1$, respectively, is delayed by the circuit 22 as explained above until word line $12_1$ has reached its threshold level, as indicated by dotted line 53, occurring about 15 nanoseconds after $t_o$. Waveforms 55 and 57 show the state of the information in the upper left hand corner memory cell 10 in FIG. 1 on the basis of which waveform is at the high state, as present in sense amplifier 20. Sense amplifier 20 amplifies these waveforms to produce the data out waveforms 59 and 61. The total elapsed time from $t_o$ to the crossover point of waveforms 59 and 61 is about 25 nanoseconds.

Figure 3A:
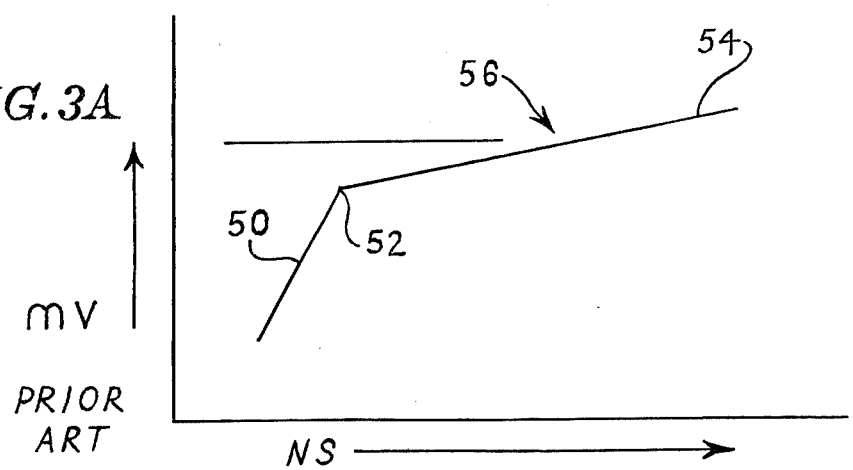
FIGS. 3A and 3B show certain waveforms of a typical prior art memory array.

FIGS. 3A, 3B, 4A, and 4B serve to illustrate why delaying the addressing of the bit/sense column lines $16_Y$ and $18_Y$ in FIG. 1 until after the word lines $12_X$ have reached their read level actually results in a significantly shorter access time for reading information out of the memory array. In FIG. 3A, the word line $12_X$ voltage is plotted vertically against time on the horizontal axis. As the word line driver Q1 or Q2 supplies a read signal on word line $12_X$, its voltage increases at a first relatively rapid rate DV/DT, as indicated at 50. In FIG. 3A, it is assumed that the bit/sense lines $16_Y$ and $18_Y$ are in the process of being addressed at break point 52 in the diagram. The increased current and capacitance as a result of connecting in the bit/sense line $16_Y$ causes the rate of change DV/DT of the word line $12_X$ voltage to decrease, thus providing a much shallower slope to the word line voltage, as indicated at 54. As a result, the voltage of the word line $12_X$ does not reach its read level until point 56.

Figure 3B:
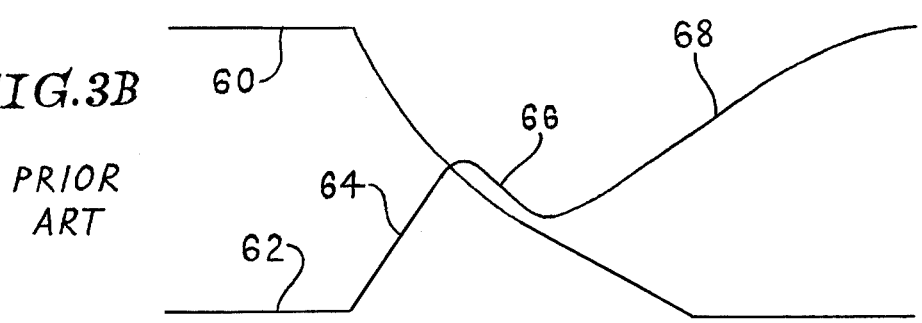

The result of having a word line voltage curve as shown in FIG. 3A is shown by the sense amplifier data out line voltage waveforms of FIG. 3B. The initial voltage levels 60 and 62 for the data out lines began to shift as the addressing of a word line $12_X$ and bit sense lines $16_Y$ and $18_Y$ takes place. However, the change 64 in the voltage level of one of the data out lines actually reverses itself as indicated at 66, due to increased current used to charge bit line $18_Y$ at the time the rate of change DV/DT of the word line $12_X$ slows down at point 52. This voltage then continues its change as indicated at 68 until a sufficient voltage difference between the two waveforms exists for sensing. The result of the waveform shape shown in FIG. 3B is to give a substantial interval during which the state of the sense amplifier is indeterminate, thus materially increasing access time for reading information out of the memory array.

Figure 4A:
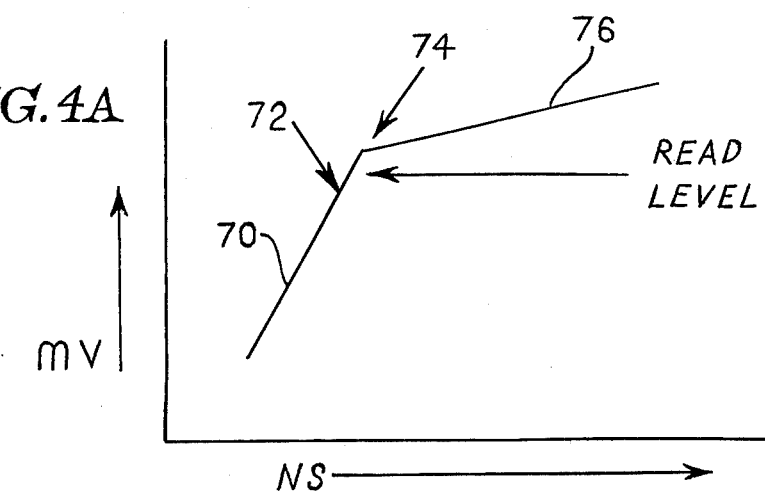
FIGS. 4A and 4B show the corresponding waveforms for a memory array incorporating the invention.
Figure 4B:
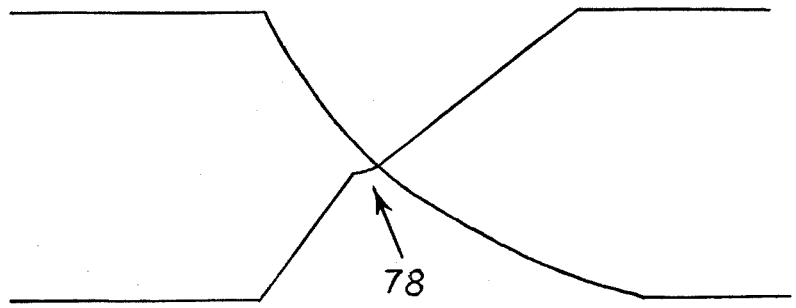

In contrast, FIGS. 4A and 4B show the results obtainable with the addition of the bit line addressing delay circuits 22. In this case, the rapid rate of change DV/DT portion 70 of the word line $12_X$ waveform is maintained until after the word line $12_X$ has reached its read level, as indicated at 72. Break point 74 corresponds to the time at which the delayed bit line addressing as a result of circuits 22 addresses the bit lines $16_Y$ and $18_Y$, thus producing the lower rate of change DV/DT for the word line $12_X$ voltage, as indicated at 76.

The result of delaying the break point 74 in the word line voltage waveform until after the read level has been reached at 72 is to give a clean transition between the sense amplifier data out voltage waveforms shown in FIG. 4B. These waveforms intersect cleanly at 78, thus materially reducing the time period of uncertainty in the signals on the sense amplifier data out lines. The slight perturbation shown at 78 caused by charging the bit/sense line $18_Y$ is all that remains of the reversal in voltage level at 66 observed with the prior art. In a typical 1K or 2K×8 static bipolar semiconductor memory array employing the Isoplanar process for its fabrication, use of the delayed column addressing in accordance with this invention reduces a memory access time of about 90 nanoseconds to about 45 nanoseconds.

It should now be apparent to those skilled in the art that a memory array capable of achieving the stated objects of the invention has been provided. Delays in accessing the memory for reading out information due to a reduction in the rate a word line approaches a suitable voltage for reading are eliminated by postpoining such a reduction in voltage change until after a suitable read voltage has been obtained. This reduces noise and disturb sensitivity of the array by producing a sharp crossover point in the relationship between read out voltages which provide the information to be sensed.

In place of the delay circuit 22 shown in FIG. 1, an R-S flip-flop could be connected to be set by line 24 from transistors Q3 and Q4. A one-shot circuit could be employed to reset the flip-flop, or the next address transition could be used to reset the flip-flop.

The circuitry shown in the drawings generally utilizes NPN bipolar transistors. The usage of transistors of the NPN type is for illustrative purposes only. PNP bipolar transistors may be used in place of some or all of the NPN transistors.

Methods for manufacturing the various components of the present invention are well known in the semiconductor art. The invention may be constructed with integrated circuits or with discrete components or with both. In a preferred embodiment, the invention is fabricated according to techniques disclosed in U.S. Pat.No. 3,648,125 on an invention of D. L. Peltzer entitled "Method of Fabricating Integrated Circuits with Oxidized Isolation and the Resulting Structure," assigned to the assignee of the present invention.

Field effect transistors may be substituted for the bipolar transistors generally depicted in the drawings. Where field-effect transistors are utilized, the terms "source," "gate," and "drain" should be substituted for the terms "emitter," "base," and "collector" respectively in the description herein. In field-effect transistors, the sources supply current and thus may be viewed as the current-source conducting regions. The drains then are the current-sink conducting regions.

While the invention has been described with reference to a particular embodiment, the description is solely for the purpose of illustration and is not to be construed as limiting the scope of the invention claimed below. For example, multi-port memories, associative memories, or other types of information storage devices may be used with the invention in place of the single-port random-access memory utilized in the above description. Thus, various modifications, changes, and applications may be made by those skilled in the art without departing from the true scope and spirit of the invention as defined by the appended claims.

What is claimed is:

1. A memory array comprising:
 a plurality of memory circuits arranged in rows and columns, the memory circuits in each row and each column having a common connection;
 means for addressing each of the rows selectively;
 sensing means connected to the columns;

means for addressing each of the columns selectively; and means for delaying the addressing of a column until after an addressed row has achieved a voltage level suitable for sensing by the sensing means, the delaying means comprising means for enabling the column addressing means upon detection of completion of addressing of the addressed row and means for detecting the completion of addressing of the addressed row, the detecting means comprising a transistor having a base connected to an end of each row opposite the row addressing means, a collector connected to a source of potential, and an emitter connected to the enabling means.

2. An electronic static memory comprising:

a plurality of static memory cells arranged in an array of rows and columns, each cell existing in a selected logic state of at least two stable logic states;

means for sensing the logic states of the cells;

means for selectively addressing each row;

means for generating at least one enabling signal after an addressed row has reached a voltage level suitable for the sensing means to sense; and means for selectively addressing each column in response to the at least one enabling signal.

3. A memory as in claim 2 wherein the means for generating comprises means for detecting when addressing of an addressed row is complete and means for producing the at least one enabling signal upon detection of completion of addressing of the addressed row.

4. An electronic static memory having a plurality of static memory cells arranged in an array of rows and columns wherein each cell exists in a selected logic state of at least two stable logic states, means for selectively addressing each row, means for selectively addressing each column, and means for sensing the logic states of the cells, characterized in that the memory includes means for delaying addressing of a column until after an addressed row has achieved a voltage level suitable for the sensing means to sense.

5. A memory as in claim 4 characterized in that the delaying means comprises means for detecting when addressing of an addressed row is complete and means for enabling the column addressing means upon detection of completion of addressing of the addressed row.

6. A memory as in claim 5 wherein the cells in each column are electrically connected to at least one column conductor for each column and the sensing means are electrically coupled to the column conductors, further characterized in that the enabling means comprises means for diverting current supplied by at least one current source coupled to the column conductors away from the column conductors until detection of completion of addressing of the addressed row.

7. A memory as in claim 5 or 6 wherein the cells in each row are electrically connected to a row conductor for each row, further characterized in that the detecting means comprises a plurality of transistors equal in number to the number of rows and corresponding on a one-to-one basis to the rows, each transistor having a current-control electrode coupled to the row conductor for the corresponding row, a first current-conducting electrode coupled to the enabling means, and a second current-conducting electrode coupled to a voltage source.

8. A memory as in claim 7 characterized in that each transistor is a bipolar transistor having a base as the current-control electrode, an emitter as the first current-conducting electrode, and a collector as the second current-conducting electrode.

* * * * *